United States Patent [19]

Belkadi et al.

[11] Patent Number: 5,768,159

[45] Date of Patent: Jun. 16, 1998

[54] METHOD OF SIMULATING AC TIMING CHARACTERISTICS OF INTEGRATED CIRCUITS

[75] Inventors: Mustapha Belkadi, Nepean; Wayne R. Sankey, Kanata, both of Canada

[73] Assignee: Northern Telecom Limited, Montreal, Canada

[21] Appl. No.: 643,136

[22] Filed: May 2, 1996

[51] Int. Cl.[6] .............................. G06F 9/455; G06F 17/50
[52] U.S. Cl. ..................... 364/578; 364/490; 371/22.1
[58] Field of Search ...................... 395/500, 555, 395/250; 371/25, 23, 22.1, 27; 307/279; 364/578, 489; 375/107; 324/617

[56] References Cited

U.S. PATENT DOCUMENTS

| | | | |
|---|---|---|---|
| 4,477,902 | 10/1984 | Puri et al. | 371/25 |
| 4,937,827 | 6/1990 | Beck et al. | 371/23 |
| 4,999,528 | 3/1991 | Keech | 307/279 |
| 5,095,454 | 3/1992 | Huang | 364/578 |
| 5,226,048 | 7/1993 | Bandali et al. | 371/22.1 |
| 5,227,674 | 7/1993 | Takahashi et al. | 307/279 |
| 5,259,006 | 11/1993 | Price et al. | 375/107 |
| 5,396,183 | 3/1995 | Farwell et al. | 324/617 |
| 5,535,223 | 7/1996 | Horstmann et al. | 371/27 |
| 5,541,849 | 7/1996 | Rostoker et al. | 364/489 |
| 5,572,717 | 11/1996 | Pedersen | 395/555 |
| 5,579,510 | 11/1996 | Wang et al. | 395/500 |
| 5,642,487 | 6/1997 | Flynn et al. | 395/250 |

OTHER PUBLICATIONS

"Mixed Behavior–Logic Simulation in a Hardware Accelerator", by P. Agrawal, IEEE Custom Integrated Circuits Conference, May 1990, pp. 9.2.1–9.2.4.

"Efficient Timing Analysis for General Synchronous and Asynchronous Circuits", by Chu et al., IEEE ASIC '90: 3rd Annual Seminar, Jun. 1990, pp. P5–4.1–P5.4–4.

"An Integrated Design and Characterization Environment for the Development of a Standard Cell Library", by J. Herbert, IEEE Custom Integrated Circuits Conference, Feb. 1991, pp. 25.6.1–25.6.5.

"Digital Board Simulation", by D. Hall, IEEE Potentials, 1995, pp. 34–38.

"A Discrete Syntax for Level–Sensitive Latched Circuits Having $n$ Clocks and $m$ Phases", by G. Jennings et al., IEEE Transactions on Computer–Aided Design of Integrated Circuits and Systems, vol. 15, No. 1, Jan. 1996, pp. 111–126.

W.I. Fletcher "An Engineering Approach to Digital Design" Chapter 5, pp. 332 and 323 (Prentice Hall, 1980).

*Primary Examiner*—Kevin J. Teska
*Assistant Examiner*—Russell W. Frejd
*Attorney, Agent, or Firm*—Angela C. de Wilton

[57] ABSTRACT

A method of simulating AC timing characteristics at the pins of a device in of an application specific integrated circuit (ASIC) design is presented. The approach is fully automatic and is generalized, in the sense that both positive and negative Setup and Hold times and Propagation delays can be captured. The approach allows each bit of a data bus to be treated individually so as to be able to identify the worst case Setup time, Hold time and Propagation delay. Measurement is carried out in parallel for all data inputs and outputs. The need for manual intervention is eliminated and considerably reduces simulation time. Delay files are used through a call from a test bench, and the same testbench can be run on different delay information, namely pre-layout or post-layout delays.

13 Claims, 2 Drawing Sheets negative Propagation Delay   positive Propagation Delay

1

METHOD OF SIMULATING AC TIMING CHARACTERISTICS OF INTEGRATED CIRCUITS

FIELD OF INVENTION

This invention relates to a method of simulating AC timing characteristics of an integrated circuit.

BACKGROUND OF THE INVENTION

Device characterization in terms of AC timing performance is an important step in ASIC design. The AC timing characterization of an ASIC is crucial for correct operation of the device with other devices on a circuit board.

One way of determining the AC timing characteristics of a device under test is through a report generated by a synthesis tool such as "Design Compiler" by SYNOPSYS™. For example, SYNOPSYS™ comprises a tool called Design Time™, which is used to provide the delays for different circuit paths of interest. The designer specifies the circuit paths to Design Time and the resulting delay values are used for calculating the estimated AC characteristics of an ASIC under development. A Design Time report contains raw data on the different paths through the device, with their associated delays, that can be used to compute the different AC timing characteristics, namely Setup time and Hold time for the inputs, and Propagation Delay for the outputs. Experience has shown that the synthesis report based approach is time consuming, because in general, a significant number of manual calculations are required from the designer. A script may be generated to manipulate data, thereby automating some of the manual calculations. Nevertheless, for each device, all the required paths have to be identified and a new script is required for each, making the approach restrictive, in the sense that it must be tailored specifically to the design under consideration.

An alternative approach is to use a waveform viewer. However, with large width buses, measurements to look for a worst case scenario would be time consuming, subject to error, and therefore impractical. Further only the device outputs could be accommodated.

Thus an improved approach to simulation of AC timing characteristics of ASICs is required.

SUMMARY OF THE INVENTION

The present invention seeks to provide a method of simulation of AC timing characteristics of an application specific integrated circuit (ASIC).

According to one aspect of the present invention there is provided a method of simulating AC timing characteristics of an integrated circuit comprising:

identifying a first flip flop associated with an input of the integrated circuit, the flip flop having a clock input, a data input and an output;

applying a clock reference signal Clkref to the clock input of the flip-flop, and applying a data input signal to the data input of the flip-flop, the data input signal edge having a specific time delay relative to the clock input signal active edge, thereby generating a known logic value at the output of the flip-flop;

then successively applying the clock reference signal and a data input signal while changing the specific time delay between the clock reference signal active edge and data input signal edge thereby relatively moving the data input signal edge and the active edge of the clock reference signal until an unknown logic value X, characteristic of an X condition, is observed at the output of the flip-flop, and then calculating one of the Setup time and Hold time from the specific delay time between the clock reference signal and data input signal for the time values preceding those when the X condition is generated.

A Setup time is measured by moving the data edge relative to the active edge of the clock. Thus a Setup time measurement is made after each decrement of the data edge, and when an X condition is observed, the Setup time preceding the value for which an X condition was observed is taken as the correct minimum Setup time, wherein the Setup time is calculated by $$\text{Setup time} = -(\text{Data}_{edge} - (\text{Clkref}_a + \text{Clkref}_{period}/2))$$

where, $\text{Data}_{edge}$ = data edge occurrence time;

$\text{Clkref}_a$ = reference clock active edge occurrence time; and $\text{Clkref}_{period}$ = period of the reference clock.

For example, the data edge is moved relative to the clock in increments, e.g. 0.01 ns increments, depending on the precision required for the measurements. The clock active edge may be either the rising edge or falling edge, depending on the device under test. The Setup times are each measured for both the rising edge and falling edge of the data signal.

A Hold measurement is made by moving the active edge of the clock relative to the data edge. Thus a Hold measurement is made after each decrement of the clock edge, and when the X condition is observed, the Hold is taken as the correct Hold for that data signal wherein the Hold time is calculated by:

$$\text{Hold} = -(\text{Clkref}_r - (\text{Data}_f + \text{Data}_{period}/2))$$

where, $\text{Clkref}_r$ = reference clock rising edge occurrence time, $\text{Data}_f$ = data falling edge occurrence time; and $\text{Data}_{period}$ = period of the data signal.

The Hold times are each measured for both the rising edge and falling edge of the data signal.

The propagation delay is measured by application of a clock reference signal to the clock input of the flip flop and data signal to a data input of the flip flop, and observing the active edge of the reference clock and the changing edge of an output data signal. The propagation delay is given by $$\text{Propagation delay} = \text{Data}_{edge} - \text{Clkref}_f$$

where $\text{Data}_{edge}$ = occurrence time of the changing data edge;

$\text{Clkref}_f$ = occurrence time of the reference clock falling edge.

If the propagation delay is measured at the occurrence of a rising edge of the reference clock, and the falling edge of the reference clock, both positive and negative propagation delays can be captured for both the rising and falling edges of the output data.

Thus, the approach is a simulation based method of carrying out AC timing characterization at the pins of the device under design. Since the simulation approach prescribes that the AC characteristic be determined for all device inputs or outputs at the same time, the method is very efficient, requiring a negligible amount of simulation time. All a designer is required to do is run a testbench on demand and collect the final AC timing characteristics from the simulation report produced by the testbench. Thus the simulation method is completely automated and significantly reduces the time required for simulation of AC timing characteristics of an ASIC. The same testbench and simulations are used for the pre-layout and post-layout delay information of the device under test.

BRIEF DESCRIPTION THE DRAWINGS

Embodiments of the invention will now be described by way of example, with reference to the accompanying drawings, in which.

DESCRIPTION OF THE PREFERRED EMBODIMENTS

Figure 1:
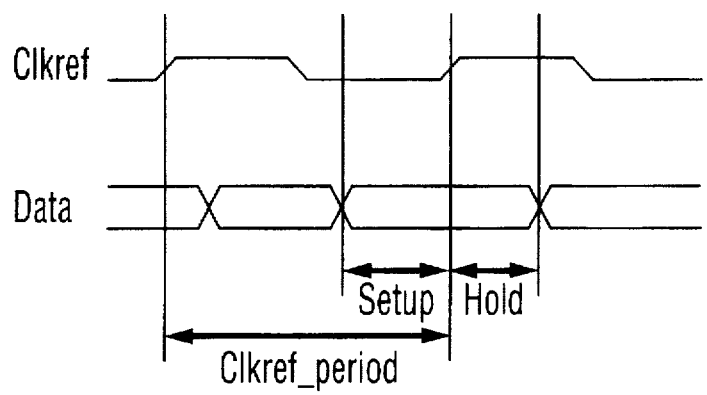
FIG. 1 shows schematically the relative timing waveforms for the clock reference and data signals used for determining Setup and Hold times in a method of simulating AC timing characteristics according to an embodiment of the present invention.

In the following description, the Set-up time is defined as the time required for the input data of a flip flop to stabilize before the triggering edge of the clock signal (see FIG. 1). If the triggering edge of the clock signal occurs before the minimum stable period of the data signal has elapsed, unpredictable behavior may occur. Unpredictable behavior may be manifest as missed data or ignored actions, or possible partial transient outputs, as described by W. I. Fletcher in "An Engineering Approach to Digital Design" Chapter 5, pp. 322 and 323 (Prentice Hall, 1980). As a result a flip-flop may be in a metastable condition, neither SET nor RESET, for an indeterminable time.

Hold time is defined as the time required for the data to remain stable after the triggering edge of the clock signal. Again if this specification is ignored, unpredictable behavior will occur. The Setup and Hold times can be negative, depending on the delay characterizing the clock and data paths. FIG. 1 shows only positive Setup and Hold times.

Thus, maintaining the Setup and Hold times given above ensures proper functioning of the device under consideration, to avoid spurious logic values that will cause the device to deliver unexpected behavior.

One of the steps in ASIC design is to acquire the quantitative knowledge of the Setup time ($t_{Setup}$) and Hold time ($t_{Hold}$) as part of device characterization.

The simulation environment used for these simulations is a standard test bench developed for the device, for example using the Verilog language. A test bench is a program that invokes all modules making up an ASIC, generates test signals or stimuli using a signal generator and monitors the response of the ASIC.

Figure 2:
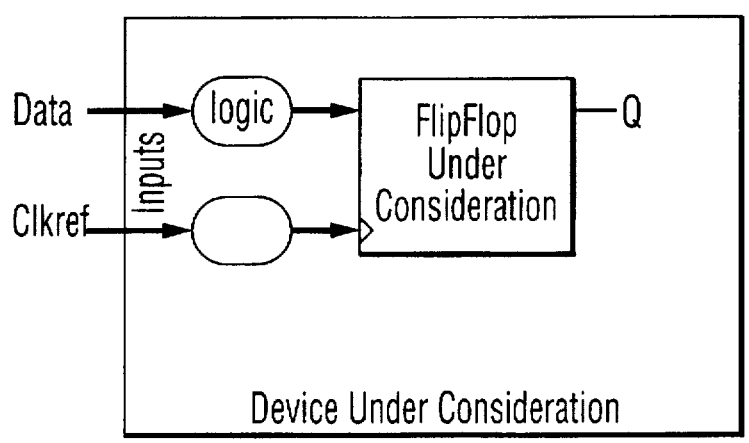
FIG. 2 shows schematically the AC timing simulation of Setup time by the method of according to the first embodiment.

The first step is to identify the first flip flop associated with inputs of the device subject to the AC timing simulation, as shown schematically in FIG. 2. FIG. 2 illustrates schematically a generalized ASIC 10 having a logic module 12, and a flip-flop 14 under consideration, with output Q, as will be described below. A reference clock signal Clkref is applied to the clock input of the device, e.g. see FIG. 3, through the test bench, and a data signal is applied to the data input of the flip-flop in such a way that a known logic value, that is a 0 or 1, is generated the flip-flop output Q. The following discussion relates to a rising edge triggered flip flop. A variable delay dt is provided between the device data input signal edge and the flip-flop data input, and the data edge is thus moved relative to the active edge of the clock (see FIG. 3) for successive clock periods, until an X (i.e. unknown) logic value is generated at the data output Q of the flip-flop. The generation of an unknown X logic value is typically referred to as an "X condition".

Setup time

Figure 3:
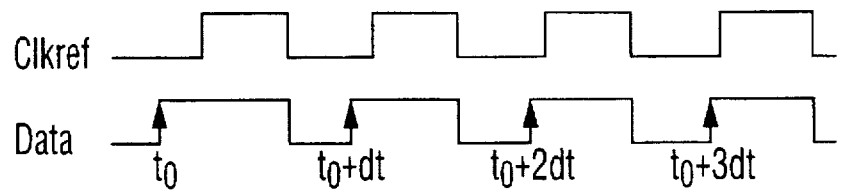
FIG. 3 shows the relative timing of the waveforms of the clock reference signal (Clkref) applied to the clock input and signal data (Data) with respect to its rising edge applied to the data input for measurement of Setup time (digital model)

First, considering measurement of the Setup time, the data edge is moved relative to the active edge of the clock reference signal for successive clock periods, for example, by decrements of 0.01 ns, and after each decrement the Setup time is measured, as indicated in FIG. 3. If an X condition is not observed at the flip flop data output, the data is moved by the same decrement and a new Setup time is measured. When the X condition is observed, the preceding value of the Setup time providing correct output data at the flip-flop, i.e. before observing the X condition, is taken as the correct minimum Setup time, i.e.

$$\text{Setup} = -(\text{Data}_{edge} - (\text{Clkref}_f + \text{Clkref}_{period}/2)) \qquad (1)$$

where, $\text{Data}_{edge}$ = data edge occurrence time;

$\text{Clkref}_f$ = reference clock falling edge occurrence time;

$\text{Clkref}_{period}$ = period of the reference clock.

Duty cycle of the Clkref signal=50%.

Two measurements are made, one at the rising data edge, and one at the falling data edge. For each input, the clock active edge is either rising or falling, depending on whether the flip-flop under consideration is falling edge triggered or rising edge triggered, respectively.

The choice of the falling edge of the reference clock for the rising edge triggered flip flops is necessary to make the test bench general in the sense that both positive and negative Setup times can be captured. That is, the measurements are made relative to the opposite edge of the active edge of interest for the clock, and then subtracting half a clock period. Thus, the clock signal is required to be symmetrical (i.e. duty cycle of the clock signal is 50%). The Setup time can be measured both with respect to the rising and falling edges of the data. This makes the proposed methodology a comprehensive methodology, since it eliminates any manual intervention in the simulation process.

Thus in general, the active edge of the clock will be either a rising edge or a falling edge of the clock reference signal, as appropriate, and $$\text{Setup} = -(\text{Data}_{edge} - (\text{Clkref}_a + \text{Clkref}_{period}/2))$$

where, $\text{Data}_{edge}$ = data edge occurrence time;

Clkref$_a$=reference clock active edge occurrence time;

Clkref$_{period}$=period of the reference clock;

and Duty cycle of the Clkref signal=50%.

Hold time

Figure 4:
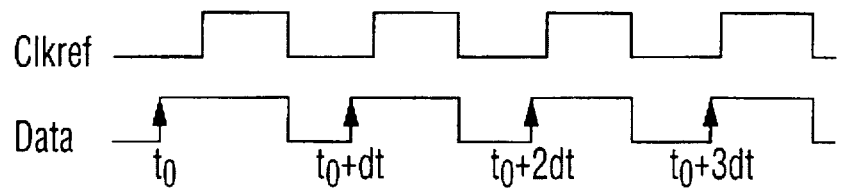
FIG. 4 shows the relative timing of the waveforms of the signal data with respect to its rising edge applied to the data input and the clock reference signal (Clkref) applied to the clock input for measurement of Hold time (digital model)

Now, considering the Hold time, the same concept is applied. Since the signal cannot be moved backwards relative to the clock reference signal, in a simulation for the Hold measurements, the data signal is applied to the device in the form of a clock signal (which could be a replication of the reference clock) whereas the reference clock is applied and moved forward each time by 0.01 ns increments, towards the data edge under consideration, i.e. either a rising or falling data edge, until an X condition is observed at the data output of the flip flop (FIG. 4). (Thus the active edge of the clock is moved relative to the data edge). As for the Setup measurement, when the X condition is observed, it is the preceding value of Hold time, which generates correct output data, that is taken as the Hold time for that data signal. Thus, the Hold time is determined using equation (2) below:

$$\text{Hold}=-(\text{Clkref}_r-(\text{Data}_f+\text{Data}_{period}/2)) \quad (2)$$

where

Clkref$_r$=reference clock rising edge occurrence time,

Data$_f$=data falling edge occurrence time

Data$_{period}$=period of the data signal.

and the duty cycle of Data input=50%

Both positive and negative Hold times can be captured, for both rising and falling edges of the data input. Again, the equation (2) may be written more generally representing the appropriate active edge of the clock reference signal as Clkref$_a$ and representing the corresponding active data edge as Data$_{edge}$.

$$\text{Hold}=-(\text{Clkref}_a-(\text{Data}_{edge}+\text{Data}_{period}/2))$$

where,

Clkref$_a$=reference clock active edge occurrence time,

Data$_{edge}$=data edge occurrence time; and

Data$_{period}$=period of the data signal;

and the duty cycle of data input=50%

While a time decrement of 0.01 ns was used in the example described above, the time increment or decrement is selected as required, and is generally determined by the precision required for the measurements.

Propagation delay

Figure 5:
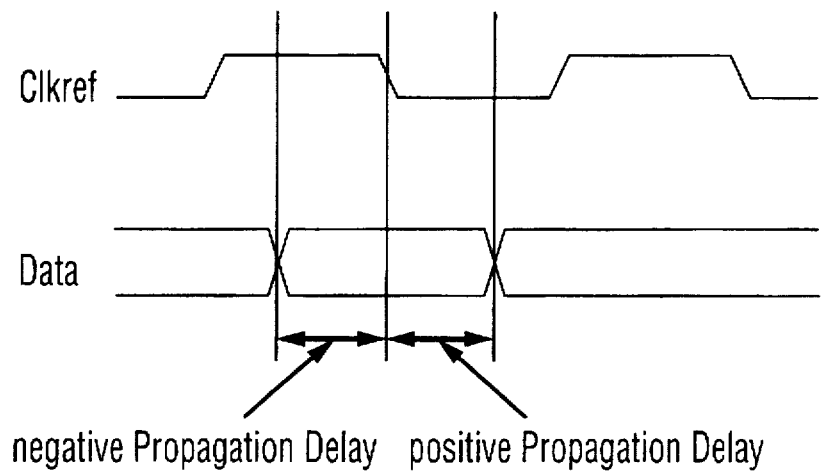
FIG. 5 shows schematically the waveforms of a clock reference signal at the clock output and data signals at the data output showing negative and positive propagation delay.
Figure 6:
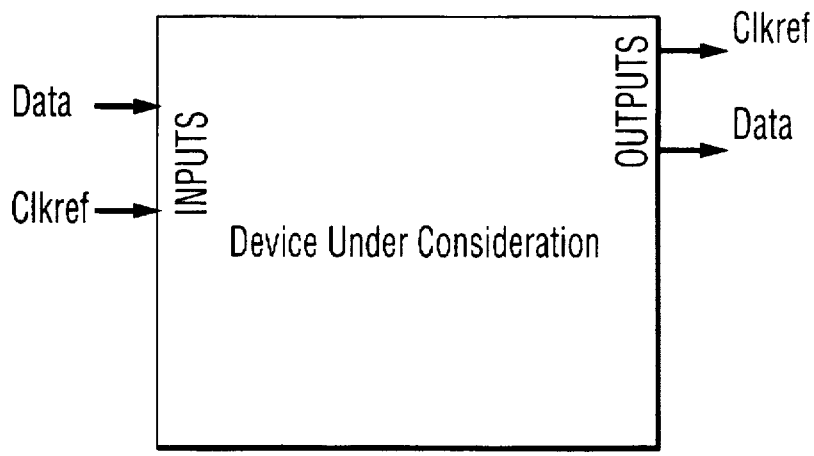
FIG. 6 shows schematically the signals applied to the inputs and observed at the outputs of the device under test for measurement of propagation delay according to an embodiment of the present invention.

Propagation delay is defined as the time it takes for the output data to change with respect to the launching (active) edge of the reference clock signal (see FIG. 5). Unlike measurement of the Setup and Hold times, the test bench monitors the occurrence of the active edge of the reference clock and the changing edge of the output data of interest (FIG. 6). The propagation delay in question can then be determined by using equation (3):

$$\text{Propagation delay}=\text{Data}_{edge}-\text{Clkref}_f \quad (3)$$

where

Data$_{edge}$=occurrence time of the changing data edge;

Clkref$_f$=occurrence time of the reference clock falling edge.

Note that the output data can experience some transients before assuming the stable state. Therefore to ensure the right data edge is being considered, i.e. the last data edge, equation (3) has to be applied at the occurrence of the rising edge of the reference clock. In this way, it is easy also to see that both positive and negative propagation delays can be captured for both the rising and falling edges of the output data. More generally, $$\text{Propagation delay}=\text{Data}_{edge}-\text{Clkref}_a,$$

where,

Data$_{edge}$=occurrence time of the changing data edge;

Clkref$_a$=occurrence time of the reference clock active edge.

Advantageously, the same test bench can be run on different sets of delay information, for example to pre-layout (statistical) delays, and post-layout delays. In testing the method on an 88 kGate chip the results conformed with manually obtained AC characteristics.

Once the actual post layout delays are known, only small corrections are required and costly and time consuming multiple iterations of design and layout are avoided.

In practice while the same test bench may be used to simulate the Setup and Hold times and the Propagation delay, other test benches are used to simulate other functions of the device and alternatively, the Propagation delay may be more conveniently measured as part of another test bench.

The approach described above allows each bit of a data bus to be characterized individually, so as to identify the worst case Setup time, Hold time and Propagation delay for each. Measurement is carried out in parallel for all data inputs and outputs. The need for manual intervention is thus eliminated and considerably reduces measurement times, and may allow identification of problems which would be missed in other test simulations.

What is claimed is:

1. A method of simulating AC timing characteristics of an integrated circuit comprising:

identifying a first flip flop associated with an input of the integrated circuit, the flip flop having a clock input and a data input;

applying a clock reference signal to the clock input of the flip-flop, and applying a data input signal to the data input of the flip-flop, the data input signal edge having a specific time delay relative to the clock signal active edge, thereby generating a known logic value at an output of the flip-flop;

then successively applying the clock reference signal and a data input signal while changing the specific time delay between the clock reference signal active edge and data input signal edge thereby relatively moving the data input signal edge and the active edge of the clock reference signal until an unknown logic value X, characteristic of an X condition, is observed at the output of the flip-flop, and calculating one of the Setup time and Hold time from the specific delay time between the clock reference signal and data input signal for the time values immediately preceding those when the X condition is generated.

2. A method of simulating AC timing characteristics of an integrated circuit comprising:

identifying a first flip flop associated with an input of the integrated circuit, the flip flop having a clock input and a data input;

applying a clock reference signal to the clock input of the flip-flop, and applying a data input signal to the data input of the flip-flop, the data input signal edge having a specific time delay relative to the clock signal active edge, thereby generating a known logic value at an output of the flip-flop;

then successively applying the clock reference signal and a data input signal while changing the specific time delay between the clock reference signal active edge and data input signal edge thereby relatively moving the data input signal edge and the active edge of the clock reference signal until an unknown logic value X, characteristic of an X condition, is observed at the output of the flip-flop, and then calculating a Setup time, wherein the data edge is moved relative to the active edge of the clock to decrement the specific delay time between the active edge of the clock reference signal and the data signal edge, and a Setup time measurement is made after each decrement of the data edge, and when the X condition is observed, the Setup time preceding the one causing the X condition is taken as the correct minimum Setup time, wherein the Setup time is calculated by $$Setup=-(Data_{edge}-(Clkref_a+Clkref_{period}/2))$$

where, $Data_{edge}$=data edge occurrence time;

$Clkref_a$=reference clock active edge occurrence time; and $Clkref_{period}$=period of the reference clock.

3. A method according to claim 2 wherein the Setup time is measured for both the rising edge of the data signal and the falling edge of the data signal.

4. A method according to claim 2 wherein the flip flop under consideration is rising edge triggered and the active edge of the clock is a falling edge.

5. A method according to claim 2 wherein the flip flop under consideration is falling edge triggered and the active edge of the clock is a rising edge.

6. A method of simulating AC timing characteristics of an integrated circuit comprising:

identifying a first flip flop associated with an input of the integrated circuit, the flip flop having a clock input and a data input;

applying a clock reference signal to the clock input of the flip-flop, and applying a data input signal to the data input of the flip-flop, the data input signal edge having a specific time delay relative to the clock signal active edge, thereby generating a known logic value at an output of the flip-flop;

then successively applying the clock reference signal and a data input signal while changing the specific time delay between the clock reference signal active edge and data input signal edge thereby relatively moving the data input signal edge and the active edge of the clock reference signal until an unknown logic value X, characteristic of an X condition, is observed at the output of the flip-flop, and then calculating a Hold time, wherein the active edge of the clock is moved relative to the data signal edge to decrement the specific delay time between the active edge of the clock reference signal and the data signal edge, and a Hold time measurement is made after each decrement of the clock edge, and when the X condition is observed, the Hold time preceding that Hold time causing the X condition is taken as the correct Hold time for that data signal, wherein the Hold time is calculated by:

$$Hold=-(Clkref_a-(Data_{edge}+Data_{period}/2))$$

where, $Clkref_a$=reference clock active edge occurrence time, $Data_{edge}$=data edge occurrence time;

$Data_{period}$=period of the data signal.

7. A method according to claim 6 wherein relative to the active edge of clock, the Hold time is measured for both the rising edge of data signal and for the falling edge of the data signal.

8. A method according to claim 6 wherein the flip flop under consideration is rising edge triggered and the active edge of clock is a falling edge.

9. A method according to claim 6 wherein the flip flop under consideration is falling edge triggered and the active edge of clock is a rising edge.

10. A method of simulating AC timing characteristics of an integrated circuit comprising:

identifying a first flip flop associated with an input of the integrated circuit having a clock input, a data input, and an output;

applying a clock reference signal to the clock input of the flip-flop, and applying a data input signal to the data input of the flip-flop with a specific time delay between the edge of the data signal and to the active edge of the clock input signal, thereby generating a known logic value at the output of the flip-flop;

observing the active edge of the reference clock and the changing edge of the output data signal, and measuring a propagation delay given by $$Propagation\ delay=Data_{edge}-Clkref_a,$$

where, $Data_{edge}$=occurrence time of the changing data edge;

$Clkref_a$=occurrence time of the reference clock active edge.

11. A method according to claim 10 wherein the flip-flop under consideration is rising edge triggered, and the propagation delay is measured at the occurrence of a falling edge of the reference clock whereby both positive and negative propagation delays can be captured for both the rising and falling edges of the output data.

12. A method according to claim 10 wherein the flip-flop under consideration is falling edge triggered, and the propagation delay is measured at the occurrence of a rising edge of the reference clock whereby both positive and negative propagation delays can be captured for both the rising and falling edges of the output data.

13. A method of simulating AC timing characteristics of an integrated circuit to determine Setup and Hold times and Propagation delay, comprising:

identifying a first flip flop associated with an input of the integrated circuit and having a clock input and a data input;

applying a clock reference signal to the clock input of the flip-flop, and applying a data input signal to the data input of the flip-flop, the data input signal edge having a specific time delay relative to the clock input signal edge, thereby generating a known logic value at an output of the flip-flop;

then successively applying the clock reference signal and a data input signal while decrementing the specific time delay between the the clock reference signal and data input signal thereby relatively moving the data edge and the active edge of the clock signal until an unknown logic value X, characteristic of an X condition, is observed at the flip flop output, determining the Setup time by moving the data edge relative to the active edge of the clock and making a Setup time measurement after each decrement of the data edge, and when the X condition is observed, the Setup time preceding the one causing the X condition is taken as the correct minimum Setup time, wherein the Setup time is calculated by $$Setup = -(Data_{edge} - (Clkref_a + Clkref_{period}/2))$$

where, $Data_{edge}$=data edge occurrence time;

$Clkref_a$=reference clock active edge occurrence time; and $Clkref_{period}$=period of the reference clock;

determining the Hold time by moving the active edge of the clock relative to the data edge and making a Hold time measurement after each decrement of the clock edge, and when the X condition is observed, the Hold time preceding that Hold time causing the X condition is taken as the correct Hold time for that data signal wherein the Hold time is calculated by:

$$Hold = -(Clkref_a - (Data_{edge} + Data_{period}/2)),$$

where $Clkref_a$=reference clock active edge occurrence time, $Data_{edge}$=data edge occurrence time; and $Data_{period}$=period of the data signal, and, measuring the propagation delay by steps comprising:

applying a clock reference signal Clkref to the clock input of the flip-flop, and applying a data input signal to a data input of the flip-flop, with a specific time delay relative to the clock input, thereby generating a known logic value at an output of the flip-flop;

observing the active edge of the reference clock and the changing edge of the output data signal, and measuring a propagation delay given by $$Propagation\ delay = Data_{edge} - Clkref_a$$

where, $Data_{edge}$=occurrence time of the changing data edge;

$Clkref_a$=occurrence time of the reference clock active edge.

* * * * *